United States Patent
Reighard et al.

(10) Patent No.: US 7,188,781 B2
(45) Date of Patent: Mar. 13, 2007

(54) METHOD AND APPARATUS FOR DETECTING A LIQUID SPRAY PATTERN

(75) Inventors: Michael A. Reighard, Avon Lake, OH (US); Kenneth Espenschied, Olmsted Township, OH (US); William E. Donges, Wellington, OH (US); Jacques Mycke, Maastricht (NL)

(73) Assignee: Nordson Corporation, Westlake, OH (US)

( * ) Notice: Subject to any disclaimer, the term of this patent is extended or adjusted under 35 U.S.C. 154(b) by 215 days.

(21) Appl. No.: 10/894,489

(22) Filed: Jul. 20, 2004

(65) Prior Publication Data

US 2005/0023367 A1 Feb. 3, 2005

Related U.S. Application Data

(63) Continuation of application No. PCT/US03/01414, filed on Jan. 16, 2003.

(60) Provisional application No. 60/350,827, filed on Jan. 22, 2002.

(51) Int. Cl.
*B67D 5/08* (2006.01)
*A01G 27/00* (2006.01)
*A62C 5/02* (2006.01)

(52) U.S. Cl. ............................ 239/71; 239/67; 239/68; 239/69; 239/73; 239/8

(58) Field of Classification Search ................. 239/67, 239/68, 69, 70, 71, 73, 1, 11, 451, 456, 458, 239/8; 427/8
See application file for complete search history.

(56) References Cited

U.S. PATENT DOCUMENTS

| 5,111,444 | A | | 5/1992 | Fukushima et al. |
| 5,235,585 | A | | 8/1993 | Bish et al. |
| 5,237,553 | A | | 8/1993 | Fukushima et al. |
| 5,271,018 | A | | 12/1993 | Chan |
| 5,303,219 | A | | 4/1994 | Kulakowski et al. |
| 5,312,039 | A | * | 5/1994 | Sayka et al. .................... 239/1 |
| 5,322,706 | A | * | 6/1994 | Merkel et al. .................. 427/8 |
| 5,380,366 | A | * | 1/1995 | Becker et al. ............... 118/712 |
| 5,418,767 | A | | 5/1995 | Gaudet et al. |
| 5,548,572 | A | | 8/1996 | Kulakowski et al. |
| 5,711,989 | A | | 1/1998 | Ciardella et al. ............. 427/96 |

(Continued)

FOREIGN PATENT DOCUMENTS

DE 19727484 2/1999

(Continued)

*Primary Examiner*—Davis Hwu
(74) *Attorney, Agent, or Firm*—Wood, Herron & Evans, L.L.P.

(57) ABSTRACT

During a liquid spray pattern detection procedure, the sensor (50, 52) is operable to detect the presence or absence of an edge of the dispensed liquid spray pattern. The nozzle (18) of the liquid dispensing system is moved to a predetermined position (A) relative to the sensor (50, 52) to determine the presence or absence of the spray pattern and is then moved to a second predetermined position (B) relative to the sensor (50, 52) to again determine the presence or absence of the spray pattern. Based on these determinations, the width of the spray pattern can be verified. This provides a quick means to verify that the width of the dispensed pattern is within certain tolerances.

12 Claims, 4 Drawing Sheets

U.S. PATENT DOCUMENTS

| | | |
|---|---|---|
| 5,715,221 A | 2/1998 | Ito et al. |
| 5,805,547 A | 9/1998 | Yamamuro |
| 5,914,928 A | 6/1999 | Takahashi |
| 6,049,515 A | 4/2000 | Yamamuro |
| 6,134,214 A | 10/2000 | Takagi et al. |
| 6,160,778 A | 12/2000 | Ito et al. |
| 6,189,118 B1 | 2/2001 | Sasaki et al. |
| 6,367,038 B1 | 4/2002 | Ko |
| 6,379,464 B1 * | 4/2002 | Martel ........................ 118/672 |
| 6,408,408 B1 | 6/2002 | Ko |
| 6,457,655 B1 * | 10/2002 | Reighard et al. ............... 239/8 |

FOREIGN PATENT DOCUMENTS

| | | |
|---|---|---|
| EP | 1080787 | 3/2001 |
| WO | WO 01/10570 | 2/2004 |

* cited by examiner

METHOD AND APPARATUS FOR DETECTING A LIQUID SPRAY PATTERN

CROSS-REFERENCE TO RELATED APPLICATIONS

This application is a continuation of PCT/US03/01414, filed Jan. 16, 2003, now pending, which claims the benefit of U.S. Provisional Application No. 60/350,827 filed on Jan. 22, 2002, and the disclosures of which are hereby incorporated by reference herein.

FIELD OF THE INVENTION

The present invention relates generally to control systems for liquid dispensers and, more particularly, to a control system and method for controlling the dispensed liquid spray pattern of a liquid dispensing system.

BACKGROUND OF THE INVENTION

Various liquid dispensing systems have been developed to dispense a liquid spray pattern from a nozzle outlet toward a surface of a substrate. For example, in conformal coating applications, liquid dispensing systems have been designed to dispense flat, fan-like liquid spray patterns of conformal coating material onto a surface of the substrate, such as a printed circuit board. The dispensing nozzle of these systems may be a cross-cut, slit or air-assisted slot nozzle, for example, that is configured to dispense the coating material as a spray, continuous band or sheet, or fibrous web of a predetermined pattern width toward the circuit board. The dispensing nozzle is typically moved by a robotic movement platform in opposite back-and-forth directions relative to the circuit board to dispense side-by-side tracks or bands of conformal coating onto the circuit board and thereby obtain a uniform moisture resistant barrier on the board surface. Alternatively, the circuit board may be moved relative to the liquid dispenser which may be fixed.

During the conformal coating process, it is important that the tracks or bands of coating join or converge along their adjacent edges, or even slightly overlap, to ensure that a full surface coating is provided on the board. Otherwise, the circuit board will be left vulnerable to undesirable chemical or moisture attack by any gaps left between the coating tracks or bands. On the other hand, too much overlap of the adjacent edges may cause undesirable bubbles in the thickened coating areas at the overlap that may also jeopardize quality control. Thus, a consistent width of the liquid spray pattern is generally necessary to obtain a uniform layer of conformal coating on circuit boards.

Unfortunately, while a liquid material dispenser may adequately and reliably dispense uniform conformal coating layers on circuit boards in one production run, changes in the viscosity and/or fluid pressure of the material will often lead to undesirable variations in the liquid spray pattern width. Additionally, contamination or partial blockage of the nozzle outlet will cause undesirable changes in the spray pattern. If these changes are not detected prior to a production run, improperly coated boards must be reworked and costly downtime of the conformal coating system is typically required to identify the problem and manually adjust the liquid dispensing system to obtain the desired pattern width and minimal offset. As those skilled in the art will readily appreciate, pattern width control is also critical in other liquid dispensing applications as well, such as in paint, flux and adhesive dispensing environments. In each of these applications, very often the edge positions of the dispensed liquid pattern relative to a substrate surface or to an adjacent liquid pattern dispensed on the substrate must be properly adjusted and set to obtain the desired material application.

Thus, there is a need for a control system for use in a liquid dispensing system that verifies the width of the dispensed liquid spray pattern.

There is also a need for a control system for use in a liquid dispensing system that improves the operator's ability to readily identify problems in the dispensed liquid spray pattern.

SUMMARY OF INVENTION

The present invention overcomes the foregoing and other shortcomings and drawbacks of liquid dispenser control systems and methods heretofore known. While the invention will be described in connection with certain embodiments, it will be understood that the invention is not limited to these embodiments. On the contrary, the invention includes all alternatives, modifications and equivalents as may be included within the spirit and scope of the present invention.

The control system of the present invention is operable to provide a quick check to determine if the liquid spray pattern dispensed from a liquid dispensing system is within prescribed limits.

In one embodiment of the present invention the control system includes a sensor, such as, but not limited to fiber optic sensor, located in the vicinity of the liquid dispensing system. Other types of sensors can include, for example, laser sensors.

The sensor may be mounted as part of a sensor fixture, which also includes a drain pan or receptacle for receiving and draining liquid material that is dispensed from the liquid dispensing system during a pattern measurement and adjustment procedure. The drain pan is fluidly connected to a fluid reservoir that is connected to main system vent air. The fiber optic sensor includes a transmitter and receiver which are mounted in confronting relationship to one another, on opposite sides of the drain pan. The transmitter and receiver are preferably each mounted in a cover or shroud that is releasably engageable with the sensor fixture.

During a liquid spray pattern detection procedure, the sensor of the sensor fixture is operable to detect the presence or absence of an edge of the dispensed liquid spray pattern. In accordance with one aspect of the present invention, the nozzle of the liquid dispensing system is moved to a predetermined position relative to the sensor to determine the presence or absence of the spray pattern and is then moved to at least a second predetermined position relative to the sensor to again determine the presence or absence of the spray pattern. Based on these determinations, the width of the spray pattern can be verified. This provides a quick means to verify that the width of the dispensed pattern is within certain tolerances. The exact width may be measured periodically. This measurement may be as set forth in U.S. Pat. No. 6,457,655 B1, the disclosure of which is incorporated by reference herein.

The above and other objects and advantages of the present invention shall be made apparent from the accompanying drawings and the description thereof.

BRIEF DESCRIPTION OF DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF THE PREFERRED EMBODIMENTS

Figure 1:
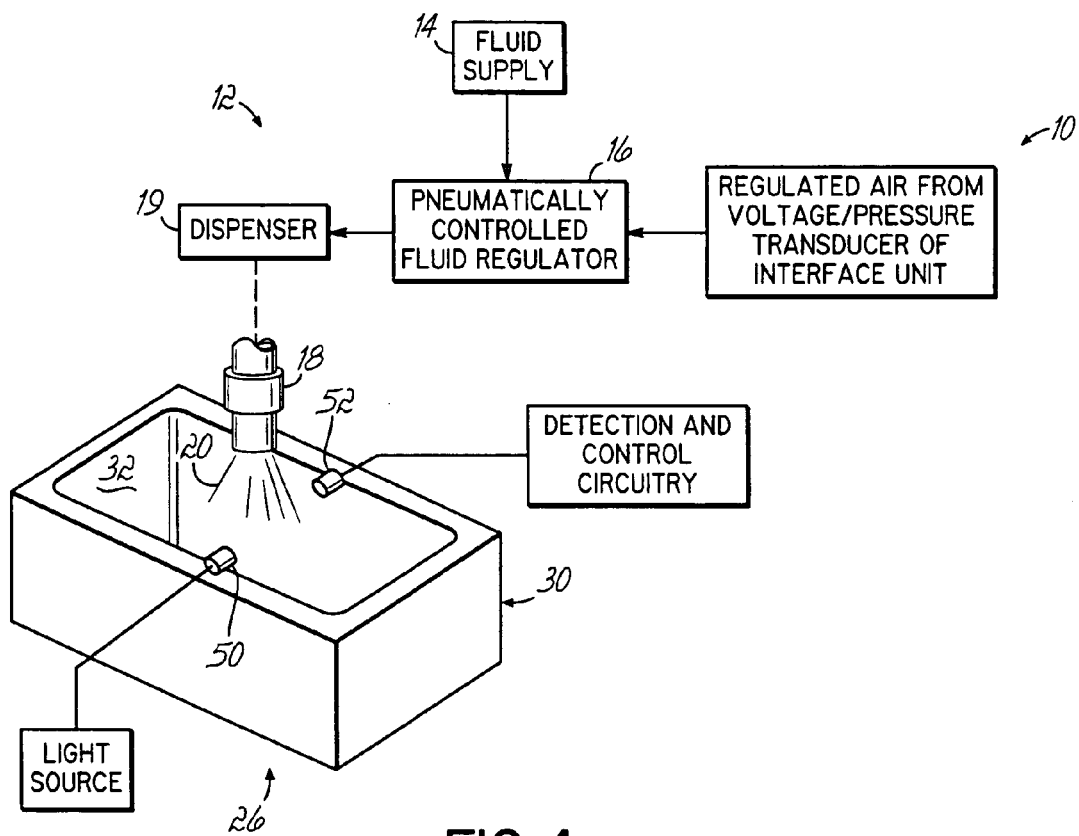
FIG. 1 is a partial schematic diagram view of a liquid spray control system in accordance with the principles of the present invention for use in a liquid dispensing system that dispenses a liquid spray pattern toward a substrate.

With reference to the figures, and to FIG. 1 in particular, a liquid spray control system, indicated generally at 10, is illustrated for use in a liquid spray dispensing system, indicated generally at 12. As described in the exemplary embodiment herein, liquid spray dispensing system 12 includes a supply of liquid material 14 that is fluidly connected to a pneumatically controlled regulator 16. The regulator 16 controls the fluid pressure of liquid material within dispensing barrel and nozzle 18 of dispenser 19 so that the liquid material may be dispensed in a flat, fan-like spray pattern. Liquid dispensing system 12 may be a Nordson® Select Coat Dispensing System manufactured and sold by Nordson Corporation of Westlake, Ohio. The barrel and nozzle 18 of the liquid dispensing system may be moved in X-Y-Z directions relative to the substrate under the control of an X-Y-Z robotic movement platform to dispense side-by-side, partially overlapping tracks of liquid material onto a surface of the substrate, such as in a conformal coating process, to provide a uniformly coated moisture proof barrier on the substrate as is well known in the art.

However, as used herein, the term "liquid spray dispensing system" is not limited in any way to liquid dispensing systems for use in a conformal coating process or to liquid dispensing systems that atomize the dispensed liquid. Rather, the term "liquid spray dispensing system" as used herein more broadly refers to any liquid material dispensing system that is operable to dispense liquid material with a predetermined pattern width in a direction toward a substrate. Thus, for example, the liquid spray control system 10 of the present invention may be used with liquid material dispensers that spray paint, adhesives, sealants or fluxes, by way of example, onto a substrate that is positioned in facing relationship to a dispensing nozzle of the dispensing system. The spray pattern dispensed from the liquid dispenser may be atomized or, alternatively, may comprise a continuous band or ribbon of dispensed liquid material, as well as a fibrous web or band of liquid material that emits from a dispensing nozzle with a predetermined pattern width. Moreover, the liquid dispense pattern may be a flat, fan-like pattern as illustrated in the exemplary embodiment described in detail herein or, alternatively, may have an oval, circular, rectangular, square or other cross-section as taken in a plane generally parallel to a plane of the substrate. Thus, as will be described in detail below, the liquid spray control system 10 of the present invention is particularly adapted to the dispensed pattern of liquid material emitting from the nozzle 18.

A sensor fixture 26 may include a drain pan or receptacle 30 that includes a recessed chamber or well 32 for receiving and draining liquid material that is dispensed by the liquid spray dispensing system 12 during the detection procedure as described in detail below. The drain pan 30 is capable of mounting to a line conveyor (not shown) or another convenient location in the workcell area. The drain pan 30 may be coupled to a fluid reservoir (not shown) that is connected to main system vent air through tubing (not shown).

The liquid spray control system 10 includes a sensor which, in the preferred embodiment, includes a fiber optic emitter or transmitter 50 and a fiber optic receiver 52 mounted in confronting relationship to one another on the opposite of the spray pattern. The transmitter 50 is operable to emit a beam of light that is received by the receiver 52 as is well known in the art.

Figure 2:
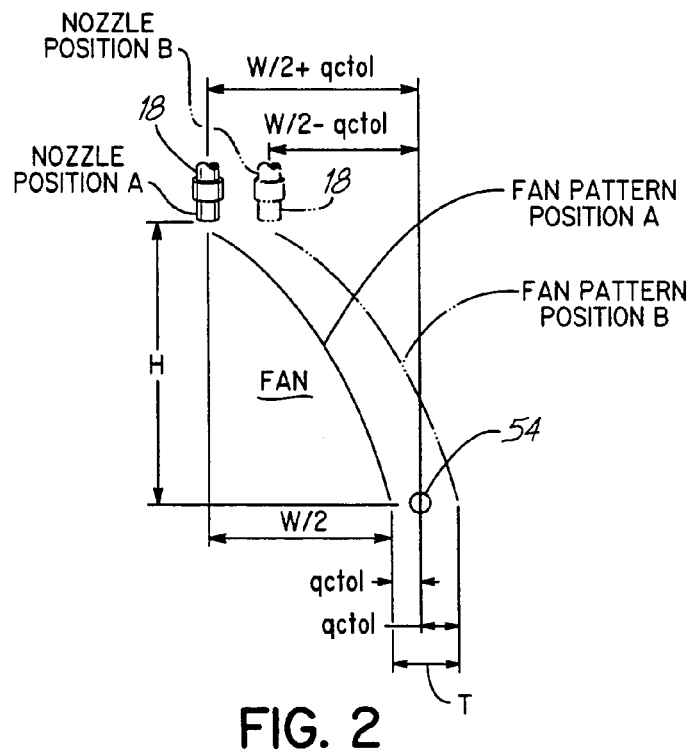
FIG. 2 is a schematic diagram of the edge detection of a spray pattern.

With continued reference to the drawings and in particular, FIG. 2, the control system determines if the width (W) of the spray pattern is within specific predetermined limits by checking one half of the spray pattern, W/2. It will be appreciated that the full width W of the pattern may be checked instead. During the detection operation, a quick check is made by moving the nozzle 18 to a first position, nozzle position A, and activating the dispenser to cause the nozzle 18 to dispense the material. The nozzle is then moved at least to a second position, nozzle position B, and the material is again dispensed.

Nozzle positions A and B are both located to one side of the beam 54 being transmitted from the transmitter 50 to the receiver 52 and are both preferably located at the same predetermined distance or height (H) above the sensor.

During normal operations, the sensor will not see the spray pattern when the nozzle is at position A but should see the pattern when the nozzle is at position B.

If the nozzle becomes clogged, the pattern may become smaller due to the reduced flow of material. As a result, the sensor will not detect the edge of the fan pattern when the nozzle is moved to position B. On the other hand, if the nozzle becomes partially clogged, the spray pattern may become skewed to one side, thereby increasing its width at that side. If this happens, the sensor will detect the edge of the spray pattern at both positions A and B. Similarly, if the spray pattern is skewed in the opposite direction, then the opposite side of the spray pattern will become smaller and will not be detected at position B and may be not even be detected at position A. To reduce or eliminate such problems, the nozzle may be moved additional positions, for example, between positions A and B. The number of positions at which the spray pattern is checked can be based on the desired tolerance and the minimum width W expected in the particular application.

Figure 3:
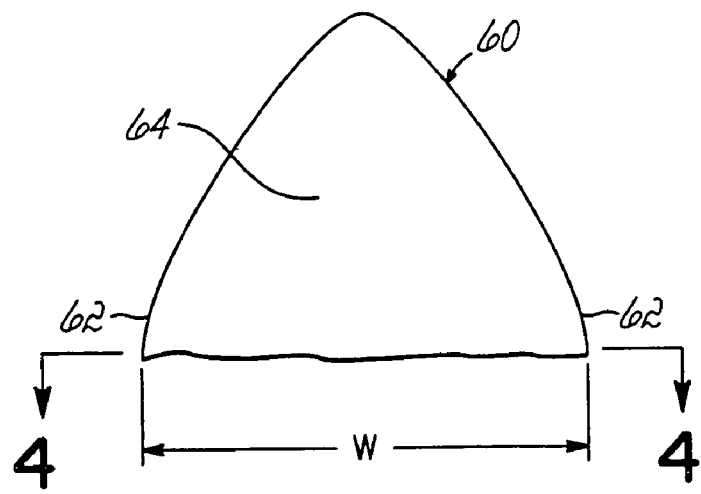
FIG. 3 is an elevational view of one type of spray pattern.
Figure 4:
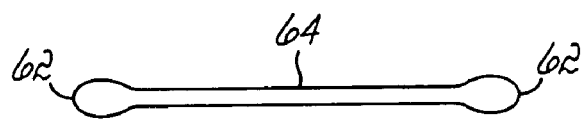
FIG. 4 is a cross-sectional view of the spray pattern taken generally along the lines of line 4—4 of FIG. 3.
Figure 5A:
FIGS. 5A–C are possible sensor signal responses of a spray pattern of FIGS. 3–4.
Figure 5B:
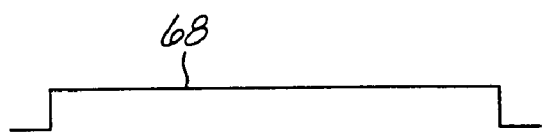
Figure 5C:
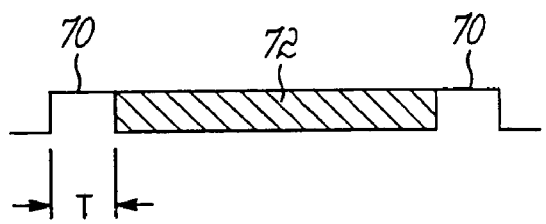

With reference to FIGS. 3–4, the fluid fan pattern 60, in general, is heavier at the edges 62, and thinner in the center section or web 64. This provides a sensing challenge for those applications utilizing a fluid that is generally transparent to the sensor. FIGS. 5A–C illustrate possible sensor responses to the fluid as a fan pattern is moved through the beam of the sensor. In FIG. 5A, the sensor detects the edges 62 generating an output 66, but does not detect the center section or web 64 and therefore does not generate an output 67. In FIG. 5B, the sensor detects the entire fan pattern, including both edges 62 and the web 64 and generates an output 68. In FIG. 5C, the sensor detects the edges 62, generating an output 70, but the web area 64 results in an unstable sensor reading or output 72. As a result, while the setting of the sensor threshold can be adjusted to give adequate detection of the edges of the fan pattern, due to sensor limitations, the web of the pattern may not be able to be detected reliably.

Because the control expects the sensor to be detected at position B, there is a limit on the distance between positions A and B. For those materials that are difficult to detect, such as those that are generally transparent. The maximum for this distance T should be the same as the width of the edge on the fan that can be detected reliably by the sensor beam 54. The distance qctol between positions A and B from the sensor beam 54 should therefore be no greater than T/2, wherein qctol is the quick check tolerance value.

For example, if it is desirable to have a 12 mm fan pattern width W with a +/−1 mm tolerance, then the total error band difference is therefore 2 mm (11–13 mm). Since the quick check looks at one side of the fan, Positions A and B need to be separated by no more than 1 mm. This means the desired qctol is 0.5 mm and the width of the edge T of the spray pattern must be at least 1.0 mm. If, however, the combination of fluid, nozzle, pressure, and sensor combine to give a T that is only 0.4 mm, then the maximum allowed value for qctol is 0.2 mm for proper operation of the quick check detection of the spray pattern. This means that positions A and B should be separated by 0.4 mm, and the detection system will be looking for a fan pattern of 12 mm +/−0.4 mm.

Figure 6:
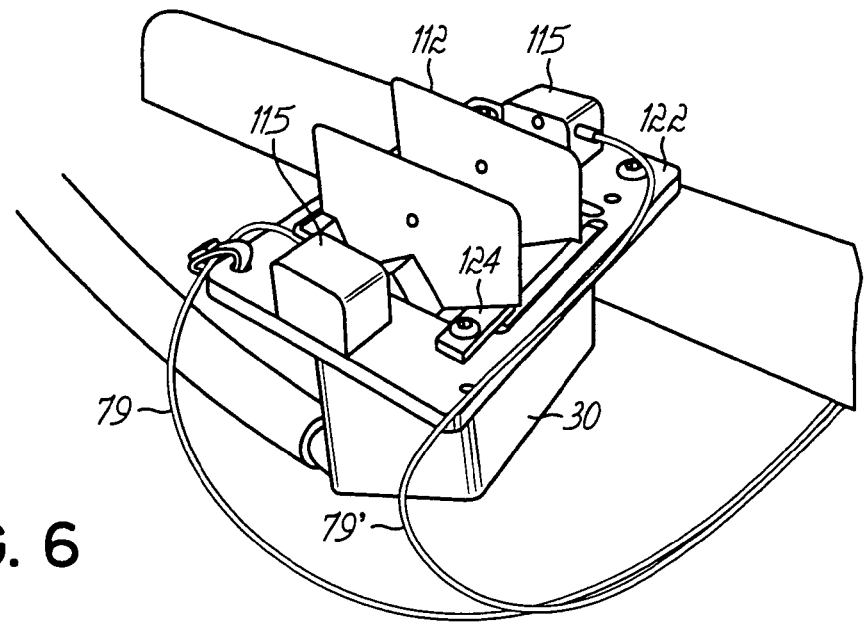
FIG. 6 illustrates one embodiment of a sensor fixture.
Figure 7:
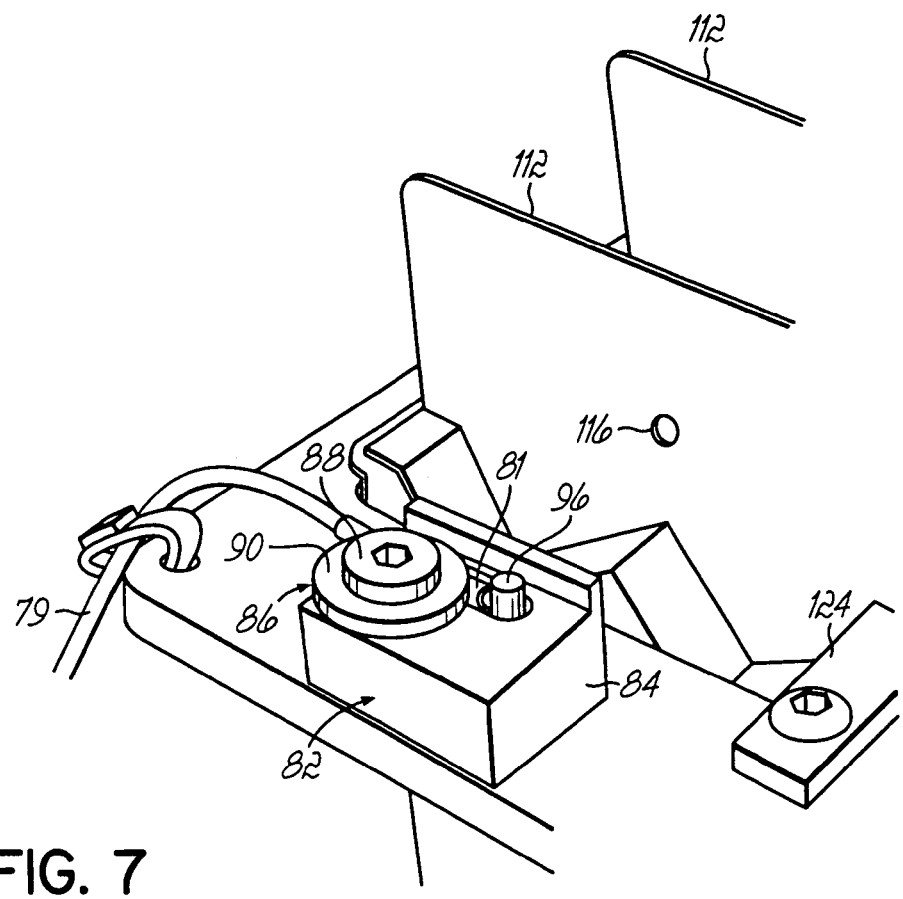
FIG. 7 illustrates an enlarged view of the sensor fixture of FIG. 6 wherein the cover of the mounting bracket assembly has been removed.
Figure 8:
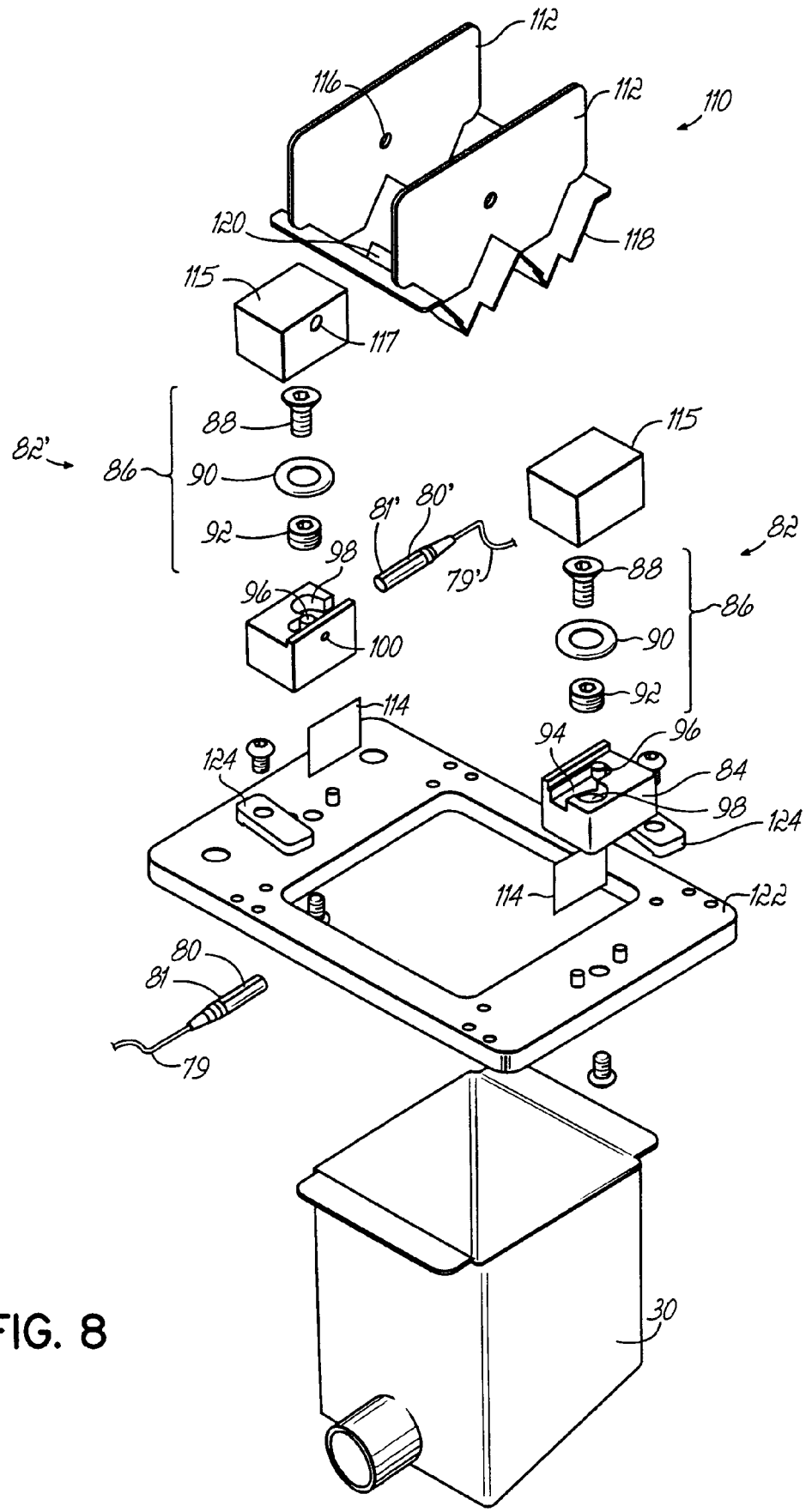
FIG. 8 is an exploded view of the sensor fixture of FIG. 6.

With reference to FIGS. 6–8, the transmitter 50 preferably includes a fiber optic cable 79 having an end 81 having a round barrel and two flats 80. Similarly, the receiver 52 includes a fiber optic cable 79' having an end 81' having a round barrel and two flats 80'. The fiber optic cables 79, 79', may be mounted to a mounting bracket assembly 82. Each mounting bracket assembly 82 includes a bracket 84 and a clamp assembly 86. The clamp assembly 86 includes a threaded bolt 88 or screw, a washer 90, and O-rings 92. The bracket 84 includes a milled slot 94, a stop pin 96 mounted at one end of the milled slot 94 and a threaded bore 98 in which the clamp assembly 86 is retained therein.

The end 81 of the fiber optic cable is inserted into the opening formed by the milled slot 94 of the bracket 84 and the washer 90 of the clamp assembly 86. The washer of the clamp assembly pushes down the top flat 80 of the end 81 and holds the bottom flat (not shown) against the milled slot maintaining the flat alignment of the fiber optic cable. The O-rings 92 of the clamp assembly push the barrel of the fiber optic cable against a flat in the slot and by rotation of the screw the end 81 of the barrel pushes against the stop pin 96 in the slot, aligning the light transmitting portion of the barrel with an aperture 100 in the side wall of the bracket 84.

When a measurement of the fan pattern is made the dispenser sprays the pattern into the air. With some materials with a low surface tension the spray will break away from the main pattern at the nozzle and/or as the fan or leaf comes together again. As the conformal coating material breaks apart, it splashes onto equipment in the vicinity of the measurement area. If the coating gets on the sensor the ambient light level of the fiber optic sensor is reduced. If the light level decreases too much the ambient light level drops below the pre-set trip point used to measure the fan width edge.

In these circumstances, a baffle assembly 110 may be used to minimize the splashing and help block splashed droplets from contacting the mounting bracket assemblies 82, 82' and in particular, the aperture openings 100 therein. The baffle assembly 110 includes two spaced apart baffles 112. During dispensing, the fan pattern of the dispensed material will be dispensed between the two baffles 112. The baffles 112 help to block airborne droplets from being deposited on the apertures 100. Additional sensor protection can be created, by adding clear lenses 114 and protective covers 115 to the mounting bracket assemblies 82, 82'. The clear lens 114 can be easily cleaned with solvent and a cotton swab. Holes 117 in the covers 115 and holes 116 in the baffles 112 allow the light beam to pass from the emitter to the receiver.

The baffles 112 are attached to a base 118. This base may be in the shape of a W. The W shape or cross section helps in reducing the splashing of the dispensed material in the vicinity of the baffle holes 116. The base 118 includes openings 120 which allows the dispensed material to pass through to the drain pan 30.

The baffle assembly 110 may be mounted to a drain pan mounting plate 122 by retaining arms 124. The drain pan 30 may be also attached to the drain pan mounting plate 122. The drain pan mounting plate 122 may be mounted to the conveyor rail of the work station or some other convenient location.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicants' general inventive concept.

The invention claimed is:

1. A method of detecting a pattern of dispensed liquid material comprising the steps of:

dispensing the liquid material in a pattern from a liquid dispenser at a first position located to a side of a sensor;

detecting the presence or absence of the pattern with the sensor;

moving the dispenser relative to the sensor to a second position, the second position being to the same side of the sensor as the first position;

detecting the presence or absence of the pattern with the sensor;

and in response to detection at the first and second positions determining the status of the pattern of dispensed liquid material.

2. A method of detecting a pattern of a dispensed liquid material comprising the steps of:

a) transmitting a beam of light;

b) moving a dispenser relative to the beam of light to a first position located to a side of the beam of light and dispensing the liquid material in a pattern;

c) generating a signal in response to the presence or absence of the pattern in the beam of light;

d) moving the dispenser relative to the beam of light to a second position located to the same side of the beam of light as the first position, to dispense the liquid material in the pattern; and e) generating a signal in response to the presence or absence of the pattern in the beam of light.

3. The method of claim 2 wherein the dispensing of the liquid material in a pattern includes the steps of:

dispensing the material in a fan like pattern having first and second edge regions and a center web section disposed between the first and second edge regions, each edge region having a width; and wherein the step of moving the dispenser to a second position includes moving the dispenser a distance which is equal to or less than one half the width of one of the edge regions of the pattern.

4. The method of claim 3 wherein the liquid material is transparent.

5. The method of claim 3 further including the step of:
in response to the signals generated determining the status of the pattern.

6. The method of claim 2 wherein the beam of light is transmitted through a pair of spaced apart baffles and the dispensed pattern of liquid material is dispensed between the baffles.

7. The method of claim 6 wherein the dispensed liquid material is received by a base, having a "W" profile extending between the pair of baffles, the material passing through the base and is collected in a pan.

8. The apparatus for detecting a pattern of dispensed liquid material comprising:
a sensor including a transmitter and a receiver mounted in confronting spaced apart relationship to one another, the transmitter transmitting a beam of light and the receiver receiving the beam of light and generating signals in response to the presence or absence of the beam of light, wherein under normal operating conditions, the pattern of dispensed liquid material will pass through the beam of light; and a baffle assembly including two spaced apart baffles attached to a base having a "W" shaped profile, the baffle assembly disposed between the transmitter and the receiver, and each baffle includes an aperture for allowing the beam of light to pass therethrough.

9. The apparatus of claim 8 further comprising a drain pan having an opening for receiving the dispensed liquid material; and wherein the baffle assembly is disposed within the opening of the drain pan, the baffle assembly including an aperture for allowing the dispensed material to pass therethrough to the pan.

10. The apparatus of claim 9 further including a pair of mounting bracket assemblies for mounting the transmitter and receiver.

11. The apparatus of claim 10 wherein the sensor is a fiber optic sensor or laser.

12. The apparatus of claim 11 wherein the mounting bracket assembly comprises a housing having a slot therein and an aperture coupled to the slot;
a clamping assembly for releasably maintaining a fiber optic cable of the sensor within the slot while maintaining the alignment of the cable with the aperture,
a lens covering the aperture; and
a cover.

* * * * *